United States Patent
Wada et al.

(10) Patent No.: US 8,162,571 B2
(45) Date of Patent: Apr. 24, 2012

(54) BULK COMPONENT FEEDER

(75) Inventors: Akifumi Wada, Fukuoka (JP); Takeshi Nishiguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 560 days.

(21) Appl. No.: 11/917,074

(22) PCT Filed: Aug. 1, 2006

(86) PCT No.: PCT/JP2006/315560
§ 371 (c)(1),
(2), (4) Date: Dec. 10, 2007

(87) PCT Pub. No.: WO2007/015568
PCT Pub. Date: Feb. 8, 2007

(65) Prior Publication Data
US 2010/0061811 A1    Mar. 11, 2010

(30) Foreign Application Priority Data
Aug. 1, 2005  (JP) ................................. 2005-222377

(51) Int. Cl.
*B65G 53/00*    (2006.01)
(52) U.S. Cl. .......................................... 406/88; 414/676
(58) Field of Classification Search .................... 406/88; 414/676
See application file for complete search history.

(56) References Cited

U.S. PATENT DOCUMENTS

| | | | |
|---|---|---|---|
| 3,976,330 A * | 8/1976 | Babinski et al. | 406/84 |
| 3,980,024 A * | 9/1976 | Futer | 406/93 |
| 4,081,201 A * | 3/1978 | Hassan et al. | 406/88 |
| 4,095,847 A * | 6/1978 | Wear | 406/85 |
| 4,155,421 A * | 5/1979 | Johnson et al. | 180/125 |
| 4,451,182 A * | 5/1984 | Lenhart | 406/86 |
| 4,462,720 A * | 7/1984 | Lenhart | 406/84 |
| 4,618,292 A * | 10/1986 | Judge et al. | 406/19 |
| 4,685,841 A * | 8/1987 | Steen et al. | 406/84 |
| 6,315,501 B1* | 11/2001 | Yagai et al. | 406/198 |
| 6,336,775 B1* | 1/2002 | Morita et al. | 406/88 |
| 6,494,646 B1* | 12/2002 | Sala | 406/88 |

(Continued)

FOREIGN PATENT DOCUMENTS

DE       101 26 088       1/2002

(Continued)

OTHER PUBLICATIONS

International Search Report Dated Jan. 30, 2007.

*Primary Examiner* — Joseph A Dillon, Jr.
(74) *Attorney, Agent, or Firm* — Pearne & Gordon LLP

(57) ABSTRACT

A bulk component feeder includes a conveying channel 42 through which the electronic components P are conveyed, a ventilation channel 43 that is formed along the conveying channel 42, and a partition 44 by which postures of the electronic components P conveyed through the conveying channel 42 are maintained and by which the conveying channel 42 is separated from the ventilation channel 43. The conveying channel 42 communicates with the ventilation channel 43 through an upper part 45 of the partition 44. It is possible to increase a size of an air channel A which acts as a flow channel for airflow and through which the electronic components P are conveyed with no respect to sizes of the electronic components P, thus, a desirable conveying speed is assured even though the conveyed electronic components P are micro-components.

14 Claims, 9 Drawing Sheets

U.S. PATENT DOCUMENTS

| | | | |
|---|---|---|---|
| 6,676,365 B2 * | 1/2004 | Adam et al. | 406/83 |
| 6,685,401 B1 * | 2/2004 | de Almeida Rodrigues et al. | 406/11 |
| 7,513,716 B2 * | 4/2009 | Hayashi et al. | 406/88 |
| 7,579,276 B2 * | 8/2009 | Itatani et al. | 438/681 |

FOREIGN PATENT DOCUMENTS

| | | |
|---|---|---|
| EP | 0 951 210 | 10/1999 |
| JP | 8279693 A | 10/1996 |
| JP | 10-294597 | 11/1998 |
| JP | 2002232188 A | 8/2002 |

* cited by examiner

BULK COMPONENT FEEDER

TECHNICAL FIELD

The present invention relates to a bulk component feeder through which electronic components (hereinafter, referred to as "components") are conveyed to a pick-up position of an electronic component mounting apparatus to feed the electronic components.

BACKGROUND ART

As a component feeder for continuously feeding components to an electronic component mounting apparatus, a bulk component feeder through which a plurality of components stocked in a bulk shape are sequentially conveyed to a pick-up position of the electronic component mounting device is known. In the bulk component feeder, a conveying channel through which the components are conveyed from a position where the components are stocked to the pick-up position is formed, and airflow is formed in the conveying channel to convey the components.

In the related art, a method where an air groove is formed along a conveying channel and an airflow channel is assured to improve a conveying function of the components is known (for example, see Patent Document 1). According to the method disclosed in Patent Document 1, airflow that is formed in the air groove comes into contact with the components in the conveying channel to convey the components in an air flow direction.

[Patent Document 1] JP-A-10-294597

In accordance with the recent trend toward small-sized and light electronic machines, components that are to be mounted on the machines have been small-sized. For example, in case of micro-components, such as 0603 chips (0.6 mm high and 0.3 mm wide), are fed into an electronic component mounting apparatus using a bulk component feeder, it is necessary for a conveying channel to be small-sized corresponding to a size of the micro-component as not to change a posture of the conveyed component. If the conveying channel is small-sized, an air groove is small-sized.

In the related art, as shown in FIG. 9, an air groove 102 is formed on an upper side of a conveying channel 101 formed in a guide 100 so as to communicate with the conveying channel. A guide cover 103 covers the air groove so that the air groove 102 acts as an airflow channel Z (a portion where oblique lines are drawn in FIG. 9). Accordingly, in the case the micro-component P is conveyed, the air groove 102 is smaller than the conveyed micro-component P, causing a small size of the airflow channel Z. Hence, since channel resistance is increased, it is impossible to assure a desirable flow speed of the airflow.

DISCLOSURE OF INVENTION

Therefore, an object of the invention is to provide a bulk component feeder through which micro-components are conveyed while a conveying speed is not reduced, and an electronic component mounting apparatus.

According to an aspect of the invention, a bulk component feeder that conveys electronic components to a pick-up position using airflow includes a conveying channel through which the electronic components are conveyed, a ventilation channel that is formed along the conveying channel, and a communication portion through which the conveying channel communicates with the ventilation channel.

According to the aspect of the invention, a ventilation channel that communicates with a conveying channel for a component is formed to assure a desirable section of an airflow channel so as to obtain a desirable flow speed of air. Thus, a conveying speed of the component is not reduced.

DESCRIPTION OF REFERENCE NUMERALS AND SIGNS

21: BULK COMPONENT FEEDER
42, 52, 62: CONVEYING CHANNEL
43, 53, 63: VENTILATION CHANNEL
44, 54: PARTITION
64: AIR GROOVE

BEST MODE FOR CARRYING OUT THE INVENTION

First Embodiment

A first embodiment of the invention will be described with reference to the accompanying drawings.

Figure 1:
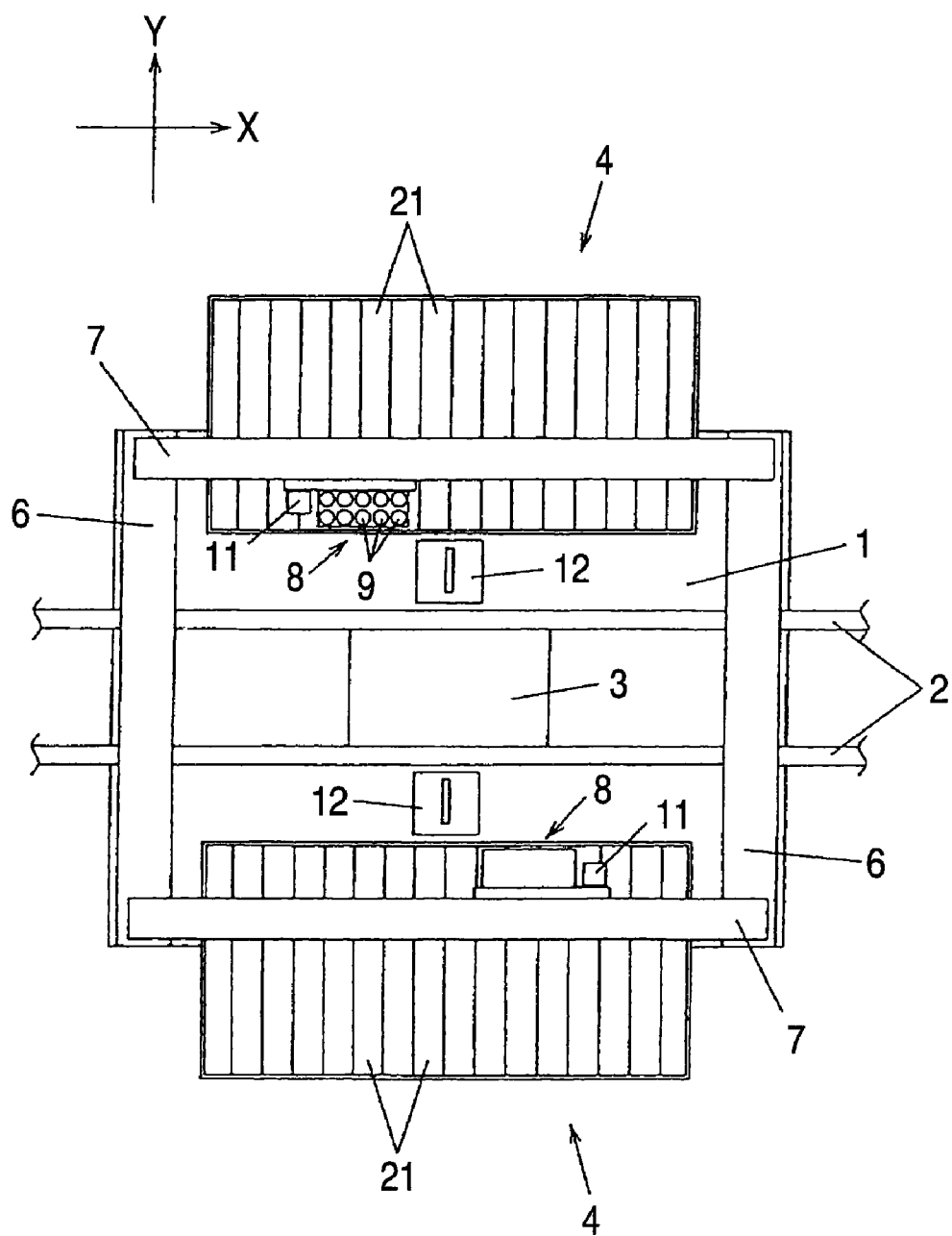
FIG. 1 is a plan view of a mounting device according to a first embodiment of the invention.

First, constituents of the mounting device of the electronic components will be described with reference to FIGS. 1 and 2. In FIG. 1, a conveying guide 2 is disposed on the center of a base 1. The conveying guide 2 acts as a substrate-positioning portion so that a substrate 3 as an object to be mounted is conveyed to be mounted on a predetermined position. In an aspect of the invention, a direction of conveying the substrate 3 is set as an X direction, and a direction that is perpendicular to the X direction on a horizontal plane is set as a Y direction.

Component feeding units 4 are disposed on both sides of the conveying guide 2 in the Y direction, and a plurality of bulk component feeders 21 are removably formed in parallel with one another. A pair of Y tables 6 are disposed at both ends of the base 1 so as to be perpendicular to the X direction. X tables 7 are built on the Y tables 6 to move in the Y direction by driving the Y tables 6. Moving heads 8 are provided on lateral surfaces of the X tables 7 to move in the X direction by driving the X tables 7. The moving heads 8 have a plurality of nozzle units 9. In FIG. 2, nozzles 10 are provided at lower components of the nozzle units 9 so as to be risen or fallen in a Z direction and to freely revolve on a Z axis (θ direction). The nozzles 10 horizontally move over the base 1 by driving the Y tables 6 and the X tables 7, and suck the components fed from the bulk component feeder 21 to pick up the components and mount the components on the substrate 3.

In FIG. 1, substrate sensing units including cameras 11 are provided on lateral surfaces of the moving heads 8 to sense the substrate 3 from above. Based on the sensing results, the components sucked with the nozzles 10 are aligned with a mounting position on the substrate 3. Component sensing units including line cameras 12 are provided between the conveying guide 2 and the component feeding units 4 to sense misalignment of the components P sucked with the nozzles 10 from below. The misalignment of the component is corrected depending on the sensing results.

Figure 2:
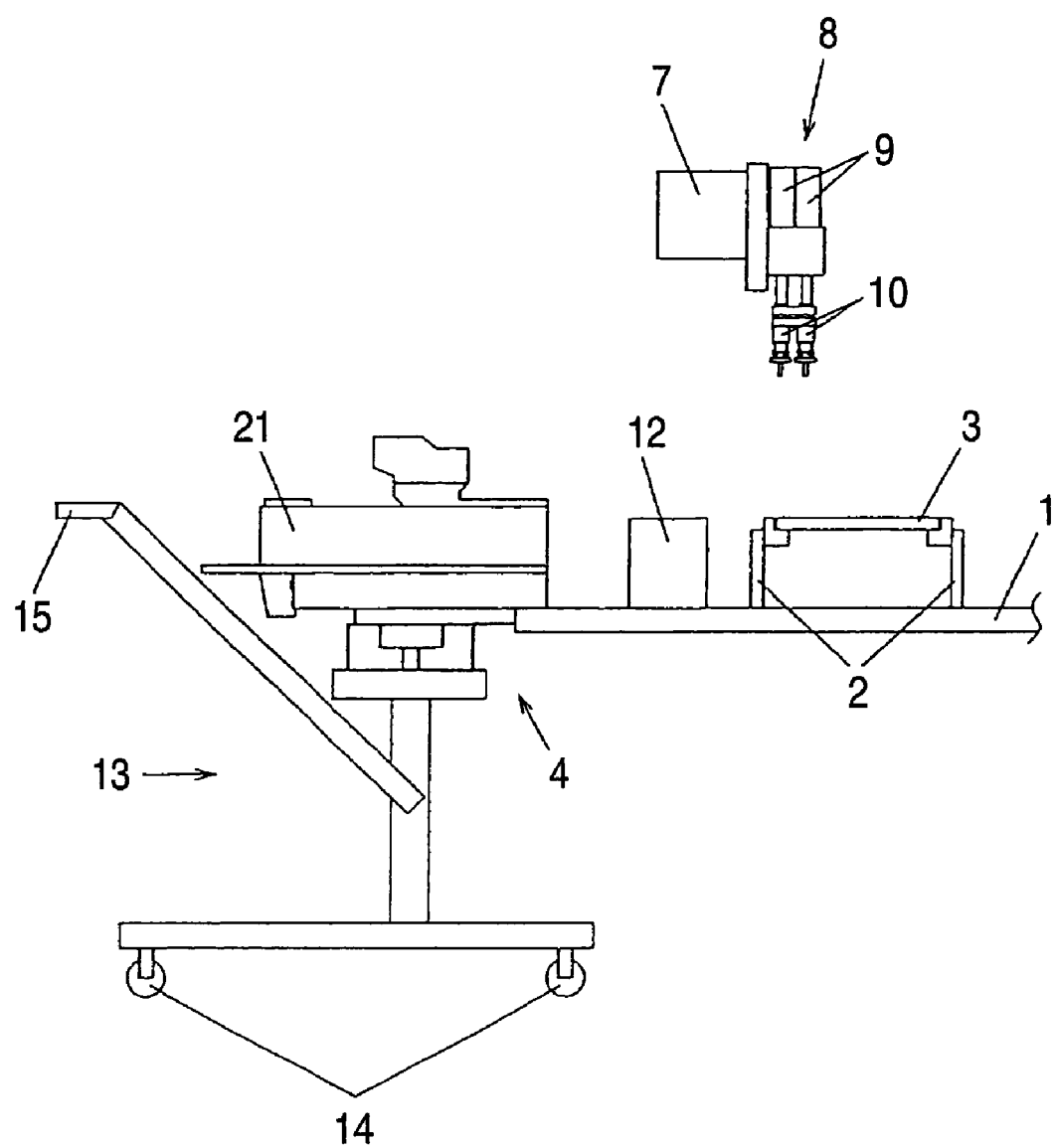
FIG. 2 is a side view of the mounting device according to the first embodiment of the invention.

In FIG. 2, the bulk component feeder 21 is maintained on a carrier 13. A wheel 14 and a handle 15 are provided in the carrier 13, and the handle 15 is operated by an operator to move the carrier 13 so that the bulk component feeder 21 enters or leaves the component feeding unit 4.

Figure 3:
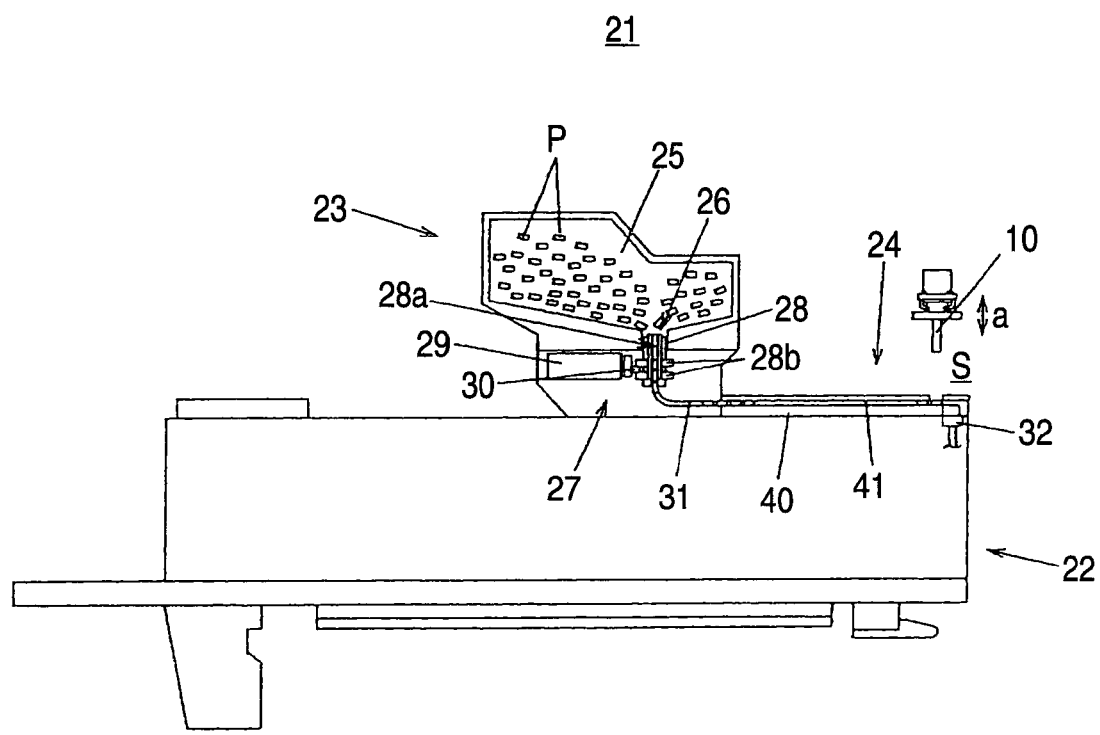
FIG. 3 is a sectional side view of a bulk component feeder according to the first embodiment of the invention.

Next, the bulk component feeder will be described with reference to FIG. 3. In FIG. 3, the bulk component feeder 21 includes a frame 22, a component feeding unit 23 disposed on an upper part of the frame 22, and a component conveying unit 24. A component stocking unit 25 is provided on an upper part of the component feeding unit 23 to stock the bulky components P. A bottom of the component stocking unit 25 has tapered surfaces, and the stocked components P are gathered on a component outlet 26 formed in the bottommost portions of the tapered surfaces. A discharge tool unit 27 is provided in the component outlet 26 to promote discharging of the stocked components P.

The discharge tool unit 27 is provided with a tub-shaped body 28 inserted in the component outlet 26. The tub-shaped body 28 is vertically moved so that an end of the tub-shaped body enters or leaves the component stocking unit 25, thereby fluidizing the components P collected in the component outlet 26. Accordingly, the components P are moved into a hollow portion 28a of the tub-shaped body 28 by ones and discharged from the component stocking unit 25. An eccentric pin 30 that is mounted on a rotation shaft of a motor 29 is fastened between a pair of upper and lower edges 28b formed at a lower part of the tub-shaped body 28, and the motor 29 is rotated to conduct the vertical movement of the tub-shaped body 28.

The hollow portion 28a inside the tub-shaped body 28 communicates with a component discharge channel 31 formed at a lower component of the component feeding unit 23, and the components P entering the hollow portion 28a move through the component discharge channel 31 into the component conveying channel 24.

The component-conveying unit 24 is provided with a guide 40 formed on an upper side of the frame 22 and a guide cover 41 covering the guide 40 from above. The components P that are stocked in the component-stocking unit 5 are conveyed in the guide 40 and picked up by the nozzles 10 at the pick-up position S. The nozzles 10 are raised and fallen (the arrow a) at the pick-up position S and suck the components P to pick up the components. A portion of the guide cover 41 that corresponds to the pick-up position S is formed so as to be capable of being opened and closed. When the components are picked up, the guide cover 41 is opened to expose the components in the guide 40.

A vacuum-sucking unit 32 for sucking air from the guide 40 to create a vacuum in the guide 40 is provided downward at the pick-up position S, and is connected to a vacuum creation source that is not shown in the drawings. If the vacuum creation source is operated, air is sucked from the guide 40 by the vacuum sucking unit 32 to vacuumize the guide 40, and air flows from the component feeding unit 23 toward the pick-up position S to convey the components which were introduced from the component feeding unit 23 to the component conveying unit 24 to the pick-up position S.

Figure 4A:
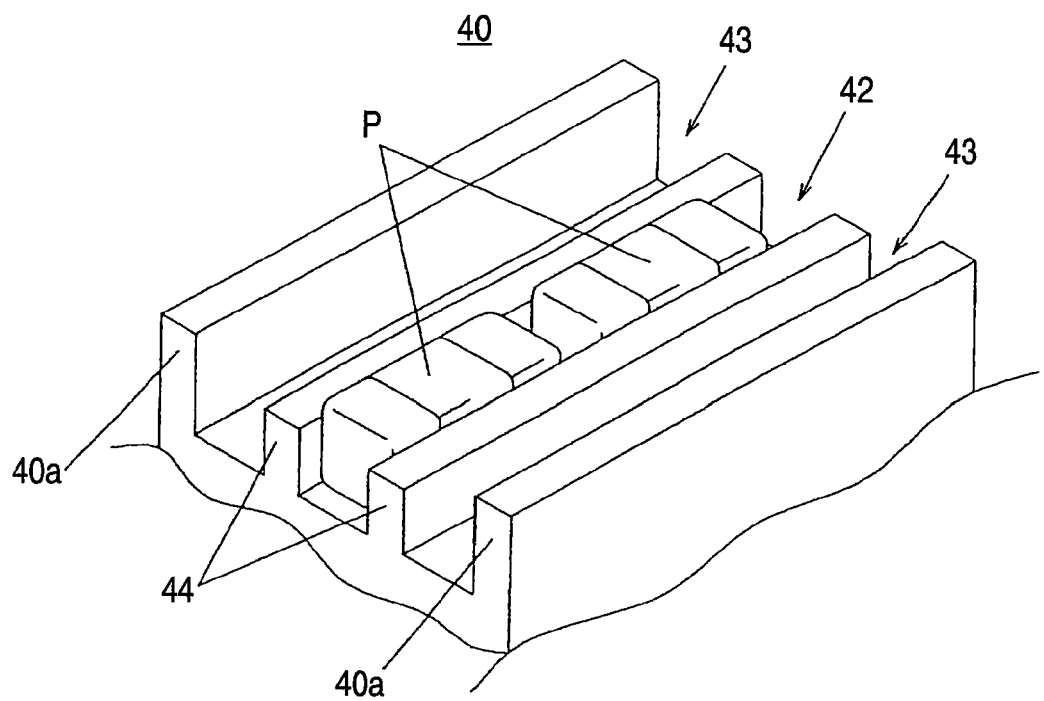
FIG. 4A is a perspective view of a component conveying unit of the bulk component feeder according to the first embodiment of the invention.
Figure 4B:
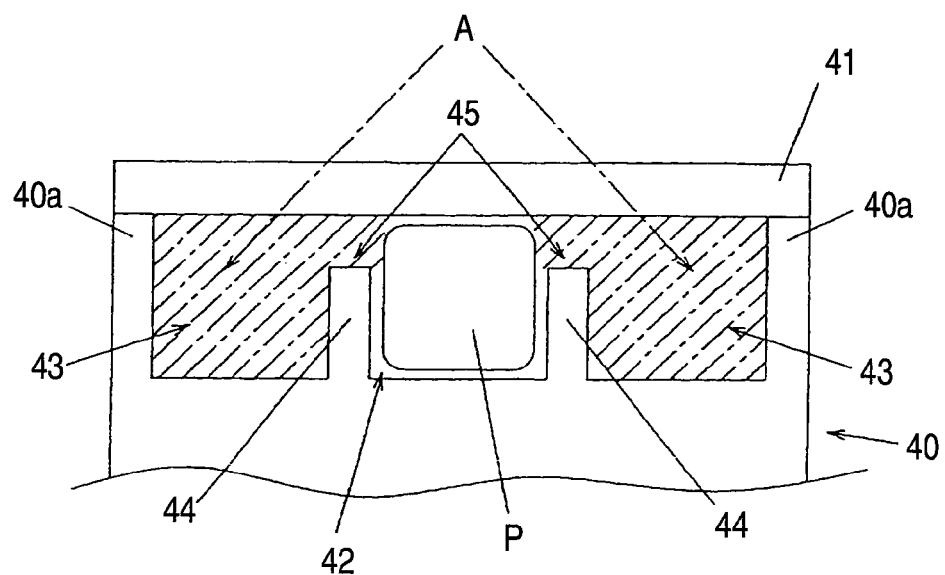
FIG. 4B is a sectional view of the component conveying unit of the bulk component feeder according to the first embodiment of the invention.

In FIG. 4A, a conveying channel 42 through which the components P are conveyed, ventilation channels 43 formed on both sides of the conveying channel 42, and partitions 44 by which a conveying posture of the components P is maintained and by which the conveying channel 42 is separated from the ventilation channels 43 are formed in the guide 40. In FIG. 4B, the guide cover 41 is provided on the guide 40 to assure airtightness of the guide 40 and, at the same time, to maintain the conveying posture of the components P conveyed through the conveying channel 42 from above. The partitions 44 are formed to be lower than both walls 40a of the guide 40, and a communication portion 45 through which the conveying channel 42 communicates with the ventilation channel 43 is formed on the partitions 44.

Figure 5:
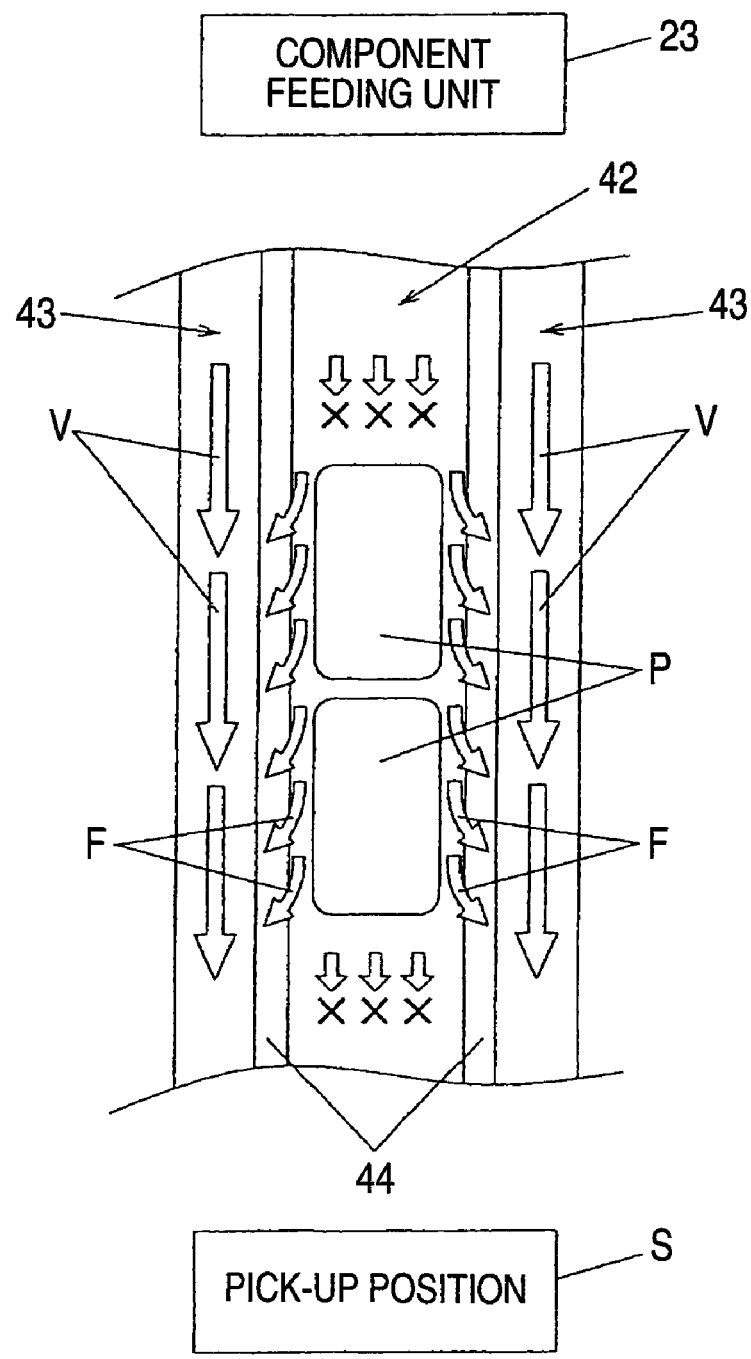
FIG. 5 is a view explaining the flow of air in the bulk component feeder according to the first embodiment of the invention.

Next, the flow of air in the guide 40 will be described. In FIG. 3, if air is sucked from the guide 40 by the vacuum sucking unit 32 to vacuumize the guide, as shown in FIG. 5, air V flows from the component-feeding unit 23 to the pick-up position S in the guide 40. As shown in FIG. 4B, since a section of the conveying channel 42 is almost completely clogged by the conveyed component P, the ventilation channel 43 and the communication portion 45 act as an air channel (A, a portion where oblique lines are drawn in FIG. 4B). Thus, air V flows in the airflow channel A. Since the air channel A has a section that is larger than that of an air channel Z of the related art shown in FIG. 9, resistance of the channel is not increased, thus a desirable flow speed of air V may be assured.

In FIG. 4B, since both lateral sides of upper portions of the components P come into contact with air flowing through the air channel A in the conveying channel 42, the components P are drawn in a direction of airflow V due to viscosity of air. That is, as shown in FIG. 5, a conveying force F is applied to the components P due to the airflow V, thereby conveying the components P to the pick-up position S. Since a desirable flow speed of air V is assured in the air channel A, the components P are conveyed at a stable speed due to the conveying force F.

Figure 6:
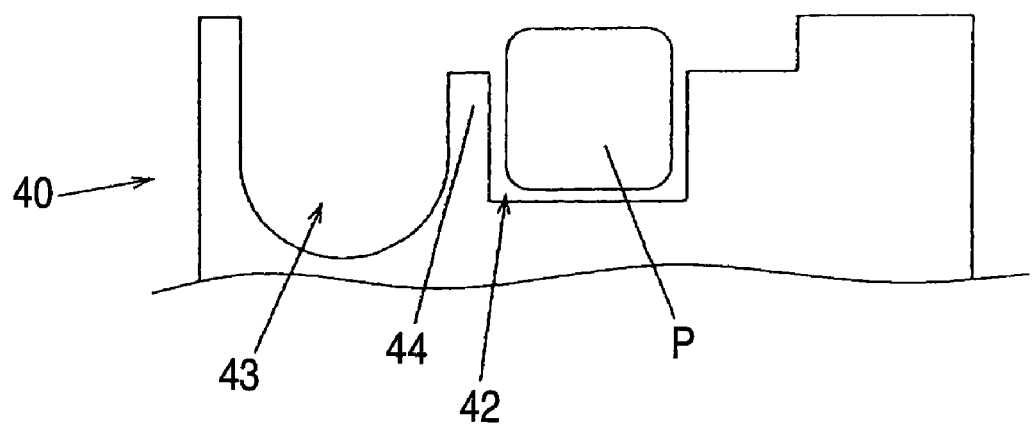
FIG. 6 is a sectional view of the component conveying unit of the bulk component feeder according to the first embodiment of the invention.

The conveying channel 42 is formed so as to have a section having the same shape as that of the component P in order to maintain the conveying posture of the component P, and the shape of the section of the ventilation channel 43 is not limited. For example, as shown in FIG. 6, a section of a bottom of the ventilation channel 43 may form an arc.

Second Embodiment

Next, a second embodiment of the invention will be described with reference to FIG. 7. Since the second embodiment is different from the first embodiment in terms of the shape of the guide, the shape of the guide will be described below.

Figure 7:
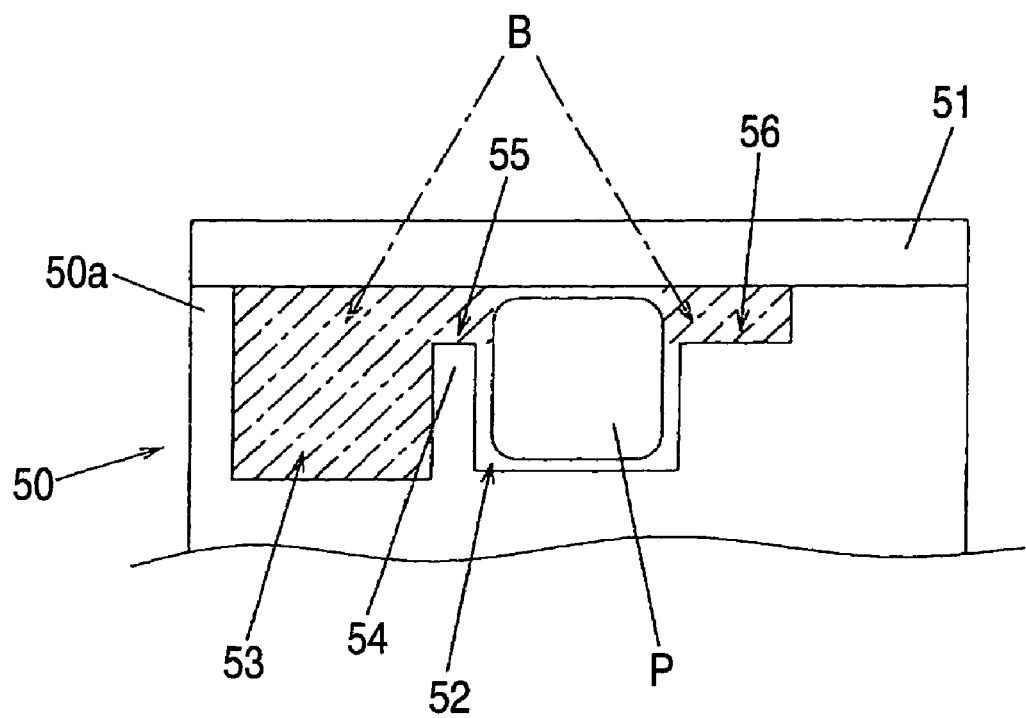
FIG. 7 is a sectional view of a component conveying unit of a bulk component feeder according to a second embodiment of the invention.
Figure 9:
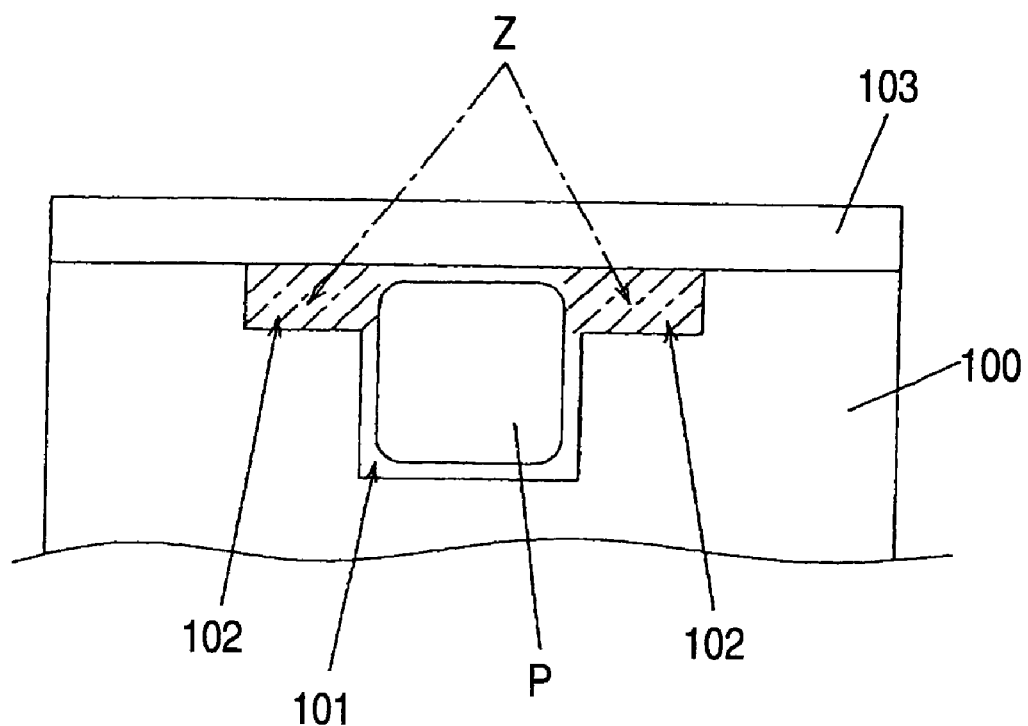
FIG. 9 is a sectional view of a component conveying unit of a known bulk component feeder.

In FIG. 7, a guide 50 is different from that of the first embodiment in that a ventilation channel 53 is formed only on one side of a conveying channel 52. The conveying channel 52 and the ventilation channel 53 are separated by a partition 54. A guide cover 51 is provided on the guide 50. The partition 54 is formed to be lower than a wall 50a of the guide 50, and a communication portion 55 through which the conveying channel 52 and the ventilation channel 53 communicate with each other is formed on the partition 54. An air groove 56 that is the same as an air groove 102 of the related art shown in FIG. 9 is formed at an upper portion of another side of the conveying channel 52.

In the guide 50, the ventilation channel 53, the communication portion 55, and an air groove 56 constitute an air channel (B, a portion where oblique lines are drawn in FIG. 7), and the components P are conveyed by air flowing through the air channel B. With respect to the flow of air through the air channel B, a desirable flow speed is assured in the ventilation channel 53 in the air channel B, thus it is possible to convey the components P at a stable speed.

Third Embodiment

Next, a third embodiment of the invention will be described with reference to FIG. 8. Since the third embodiment is different from the first embodiment in terms of shapes of the guide and the guide cover, the shapes of the guide and the guide cover will be described below.

Figure 8:
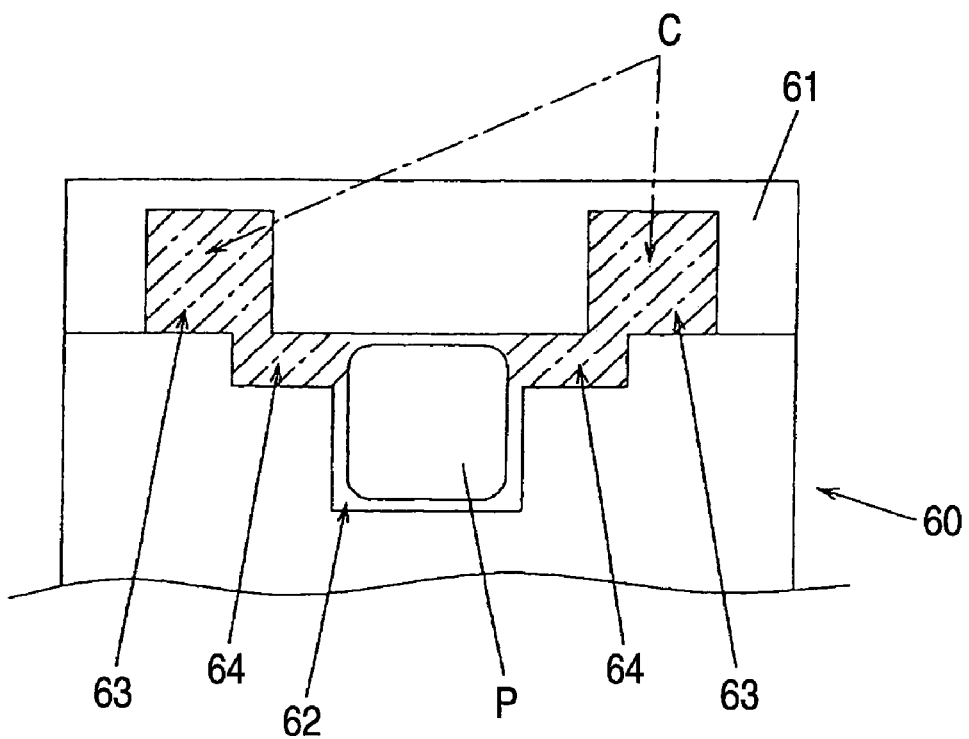
FIG. 8 is a sectional view of a component conveying unit of a bulk component feeder according to a third embodiment of the invention.

In FIG. 8, a guide 60 and a guide cover 61 are different from those of the first embodiment in that a ventilation channel 63 is formed in the guide cover 61 instead of the guide 60. In the guide 60, a conveying channel 62 and an air groove 64 that are the same as the known guide 100 shown in FIG. 9 are formed. Two ventilation channels 63 are formed on a side of the guide cover 61 that faces the guide 60. The ventilation channels 63 communicate with the air groove 64 formed in the guide 60 while the guide cover 61 is provided on the guide 60. In connection with this, the air groove 64 forms a communication portion through which the conveying channel 62 communicates with the ventilation channels 63. A portion between two ventilation channels 63 maintains a conveying posture of the component P conveyed through the conveying channel 62 from above, thus being slightly wider than a width of the component P.

In the guide 60 and the guide rail 61, the ventilation channels 63 and the air groove 64 form an air channel C (a portion in which oblique lines are drawn in FIG. 8), and the components P are conveyed by air flowing through the air channel C. It is possible to use one of the ventilation channels 63, and the shape of section of the ventilation channel 63 is not limited.

As described above, in a bulk component feeder of an aspect of the invention, since a section of an air channel is formed large while a conveying posture of components conveyed through a conveying channel is maintained, a desirable conveying speed can be assured even though the conveyed components are micro-components. Additionally, in a mounting device using the bulk component feeder, feeding of the components through the bulk component feeder is stable, thus, mounting efficiency is improved.

This application is based upon and claims the benefit of priority of Japanese Patent Application No. 2005-222377 filed on Aug. 1, 2005, the contents of which are incorporated herein by reference in its entirety.

INDUSTRIAL APPLICABILITY

According to a bulk component feeder and a mounting device using the bulk component feeder of an aspect of the invention, a ventilation channel is formed so as to communicate with a conveying channel for conveying components, thus, a desired section of an air channel is assured. Accordingly, there is an advantage in that, since a desired flow speed of air is assured, a conveying speed of the components is not reduced. The bulk component feeder and the mounting device are useful for a mounting field using the bulk component feeder through which bulky components are conveyed to a pick-up position of the mounting device to conduct feeding.

The invention claimed is:

1. A bulk component feeder that conveys electronic components from a component feeding unit to a pick-up position by airflow, the bulk component feeder comprising:
    a conveying channel through which the electronic components are conveyed;
    a ventilation channel that is formed along the conveying channel;
    a communication portion through which the conveying channel communicates with the ventilation channel; and
    a vacuum-sucking unit that sucks the air in the ventilation channel and causes an air flow in the ventilation channel from the conveying channel through the communication portion,
    wherein the air flows from the component feeding unit toward the pick-up position along the ventilation channel.

2. The bulk component feeder according to claim 1, wherein the communication portion maintains postures of the electronic components conveyed through the conveying channel, and is provided on a partition by which the conveying channel is separated from the ventilation channel so that the conveying channel communicates with the ventilation channel through the communication portion.

3. The bulk component feeder according to claim 2, wherein the ventilation channel is formed on both sides of the conveying channel.

4. The bulk component feeder according to claim 2, wherein the ventilation channel is formed on one side of the conveying channel.

5. The bulk component feeder according to claim 1, wherein the ventilation channel is formed in a cover covering the conveying channel from above.

6. The bulk component feeder according to claim 5, wherein the conveying channel communicates with the ventilation channel through the communication portion while the cover covers the conveying channel.

7. A bulk component feeder that conveys electronic components from a component feeding unit to a pick-up position by airflow that flows from a component feeding unit toward the pick-up position, the bulk component feeder comprising:
    a guide comprising:
        a conveying channel through which the electronic components are conveyed;
        a ventilation channel that is formed along the conveying channel; and
        a communication portion through which the conveying channel communicates with the ventilation channel;
    a guide cover that covers the guide to ensure an airtightness of the guide and to maintain a conveying posture of a component conveyed through the conveying channel; and
    a vacuum-sucking unit that sucks the air in the guide and causes an air flow in the ventilation channel from the conveying channel through the communication portion,
    wherein the air flows from the component feeding unit toward the pick-up position along the ventilation channel.

8. The bulk component feeder according to claim 7, wherein the air flow in the ventilation channel causes a conveying force, and the conveying force communicated through the communication portion forces the component in the conveying channel move forward.

9. A bulk component feeder that conveys electronic components from a component feeding unit to a pick-up position by airflow that flows from a component feeding unit toward the pick-up position, the bulk component feeder comprising:

a guide comprising:

a conveying channel through which the electronic components are conveyed;

a ventilation channel that is formed along the conveying channel; and an air groove through which the conveying channel communicates with the ventilation channel;

a guide cover that covers the guide to ensure an airtightness of the guide and to maintain a conveying posture of a component conveyed through the conveying channel, wherein the guide cover comprises the ventilation channel therein; and a vacuum-sucking unit that sucks the air in the guide and causes an air flow in the ventilation channel from the conveying channel through the communication portion, wherein the air flows from the component feeding unit toward the pick-up position along the ventilation channel.

10. The bulk component feeder according to claim 9, wherein the air flow in the ventilation channel causes a conveying force, and the conveying force communicated through the air groove forces the component in the conveying channel move forward.

11. The bulk component feeder according to claim 1, wherein the section of the conveying channel has the same shape as the section of the component.

12. The bulk component feeder according to claim 7, wherein the section of the conveying channel has the same shape as the section of the component.

13. The bulk component feeder according to claim 9, wherein the section of the conveying channel has the same shape as the section of the component.

14. The bulk component feeder according to claim 1, wherein the airflow flows from a component feeding unit toward the pick-up position.

* * * * *